(12) United States Patent
Kurihara et al.

(10) Patent No.: US 6,200,711 B1
(45) Date of Patent: Mar. 13, 2001

(54) PHASE MASK FOR MANUFACTURING DIFFRACTION GRATING, AND METHOD OF MANUFACTURE

(75) Inventors: Masaaki Kurihara; Toshikazu Segawa, both of Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 09/380,196

(22) PCT Filed: Jan. 20, 1999

(86) PCT No.: PCT/JP99/00174

§ 371 Date: Aug. 27, 1999

§ 102(e) Date: Aug. 27, 1999

(87) PCT Pub. No.: WO99/38040

PCT Pub. Date: Jul. 29, 1999

(30) Foreign Application Priority Data

Jan. 22, 1998 (JP) .................................. 10-010365
Feb. 5, 1998 (JP) .................................. 10-024266

(51) Int. Cl.⁷ .................................................... G03F 9/00
(52) U.S. Cl. ................................................................ 430/5
(58) Field of Search ........................ 430/5, 322; 385/37, 385/10

(56) References Cited

U.S. PATENT DOCUMENTS 5,818,988 * 10/1998 Modavis .................................... 430/5
5,972,542 * 10/1999 Starodubov ............................... 430/5

FOREIGN PATENT DOCUMENTS

| | | |
|---|---|---|
| 58-198006 | 11/1983 | (JP) . |
| 58-198007 | 11/1983 | (JP) . |
| 60-38022 | 8/1985 | (JP) . |
| 60-241287 | 11/1985 | (JP) . |
| 2-228602 | 9/1990 | (JP) . |
| 4-239791 | 8/1992 | (JP) . |
| 6-235808 | 8/1994 | (JP) . |
| 6-265709 | 9/1994 | (JP) . |
| 7-140311 | 5/1995 | (JP) . |
| 7-198920 | 8/1995 | (JP) . |
| 8-334610 | 12/1996 | (JP) . |
| 9-297207 | 11/1997 | (JP) . |

OTHER PUBLICATIONS

G.P. Luo et al, "LiNbO3 phase gratings prepared by a single excimer pulse through a silica phase mask"; Appl. Phys. Lett., vol. 69(10) (Sep. 2, 1996), pp. 1352–1354.

* cited by examiner

Primary Examiner—S. Rosasco
(74) Attorney, Agent, or Firm—Dellett and Walters

(57) ABSTRACT

The invention relates to a diffraction grating-forming phase mask which can make the diffraction grating to be formed substantially free of any defect, even when foreign matters or resins, etc. sublimed from an optical fiber are deposited on the surface of the phase mask. The phase mask 21 comprises a substrate and a grating form of repetitive groove (26)-and-strip (27) pattern for forming a diffraction grating by interference fringes of diffracted light through the repetitive pattern. An optically transparent protective layer 30 is applied over the surface of the substrate with the repetitive groove (26)-and-strip (27) pattern formed thereon.

11 Claims, 7 Drawing Sheets

PHASE MASK FOR MANUFACTURING DIFFRACTION GRATING, AND METHOD OF MANUFACTURE

TECHNICAL ART

The present invention relates generally to a diffraction grating-forming phase mask and its fabrication method, and more particularly to a phase shift mask for using ultraviolet laser light to form a diffraction grating in an optical fiber used for optical communications, etc.

BACKGROUND ART

Optical fibers have brought about breakthroughs in the globalization of communications to make high-quality and large-capacity inter-oceanic telecommunications feasible. So far, it has been known that a Bragg diffraction grating is provided in an optical fiber by creating a periodic refractive index profile in an optical fiber core along the optical fiber, and the magnitude of reflectivity and the width of the wavelength characteristics of the diffraction grating are determined by the period and length and the magnitude of refractive index modulation of the diffraction grating, whereby the diffraction grating can be used as a wavelength division multiplexer for optical communications, a narrow-band yet high-reflection mirror used for lasers or sensors, a wavelength selection filter for removing extra laser wavelengths in fiber amplifiers, etc.

However, the wavelength at which the attenuation of a quartz optical fiber is minimized and which is suitable for long-distance communications is 1.55 μm. It is thus required hat the grating spacing be about 500 nm in order to allow the optical fiber diffraction grating to be used at this wavelength. At the beginning, it was considered difficult to make such a minute structure in an optical fiber core; that is, a Bragg diffraction grating was provided in the optical fiber core by a sophisticated process comprising a number of steps, e.g., side polishing, photoresist coating, holographic exposure, and reactive ion beam etching. For this reason, much fabrication time was needed, resulting in low yields.

In recent years, however, a method of fabricating a diffraction grating by irradiating an optical fiber with ultraviolet radiation to cause a refractive index change directly in an optical fiber core has been developed. This ultraviolet irradiation method has been steadily put to practical use with the advance of peripheral technologies, because of no need of any sophisticated processes.

Since the grating spacing is as fine as about 500 nm as mentioned above, this method using ultraviolet light is now carried out by a two-beam interference process, a writing-per-point process wherein single pulses from an excimer laser are focused to make diffraction grating surfaces one by one, an irradiation process using a phase mask having a grating, etc.

Regarding the two-beam interference process, a problem arises in conjunction with the quality of the beams in the lateral direction, i.e., spatial coherence. A problem with the writing-per-point process is on the other hand that strict step control of the submicron order is needed to focus light on a small point for writing light on many surfaces. Another problem arises in conjunction with processability.

To solve these problems, attention has focused on the irradiation process using a phase mask. According to this process, a phase mask 21 comprising a quartz substrate provided on one surface with grooves of given depth at a given pitch is irradiated with KrF excimer laser light (of 248 nm wavelength) 23 to give a refractive index change to a core 22A of an optical fiber 22, thereby producing a grating (diffraction grating), as shown in FIG. 7(a). For a better understanding of an interference pattern 24 on the core 22A, the pattern 24 is exaggerated in FIG. 7(a). FIG. 7(b) is a sectional view of the phase mask 21, and FIG. 7(c) is a partial top view corresponding to FIG. 7(b). The phase mask 21 has a binary phase type of diffraction grating structure where the substrate is provided on one surface with grooves 26 having a depth D at a repetition pitch P, with a strip 27 substantially equal in width to each groove being provided between adjacent grooves 26.

The depth of each groove 26 on the phase mask 21 (the difference in height between strip 27 and groove 26) D is chosen such that the phase of the excimer laser light (beam) 23 that is exposure light is modulated by π radian. Thus, zero-order light (beam) 25A is reduced to 5% or less by the phase mask 21, and chief light (beam) leaving the mask 21 is divided into + first-order diffracted light 25B containing at least 35% of diffracted light and − first-order diffracted light 25C, so that the optical fiber 22 is irradiated with the + first-order diffracted light 25B and − first-order diffracted light 25C to produce an interference fringe at a given pitch, thereby providing a refractive index change at this pitch in the optical fiber 22.

When the diffracting grating is fabricated in the optical fiber 22 by interference of + first-order light 25B and − first-order light 25C using such a phase mask 21, deposition of foreign matters on the surface of the phase mask 21 causes defects in the diffraction grating exposed to light in the optical fiber 22. This in turn gives rise to noises in the characteristic spectra of the diffraction grating.

When the optical fiber 22 is irradiated with ultraviolet radiation 25B and 25C according to such an arrangement as shown in FIG. 7(a), the covering resin of the optical fiber 22 is sublimated due to exposure to ultraviolet radiation 25B and 25C, filling up the grooves 26 in the phase mask 21. This offers a similar defect problem with respect to the diffraction grating exposed to light in the optical fiber.

A prior grating constituting such a diffraction grating-fabricating phase mask 21 has a reduced diffraction efficiency and so shows an about 3% transmittance with respect to zero-order light 25A because the grooves 26 are of a rectangular wave shape in section, as shown in FIG. 7(b). This zero-order light component 25A makes noises, which in turn appear in the reflection spectra of the transferred optical waveguide diffraction grating.

DISCLOSURE OF THE INVENTION

In view of such problems with the prior art as mentioned above, one object of the present invention is to provide a diffraction grating-forming phase mask which, even when foreign matters, resins sublimated from an optical fiber, etc. are deposited on the surface thereof, makes it unlikely to introduce defects in the diffraction grating to be formed.

Another object of the invention is to provide a diffraction grating-fabricating phase mask which can reduce as much as possible a zero-order light component transmitting through the phase mask without subjected to diffraction, so that no noise can be introduced in the reflection spectra of an optical waveguide diffraction grating obtained by transfer, and a method of fabricating such a phase mask.

To achieve the aforesaid first object of the invention, the invention provides a diffraction grating-forming phase mask comprising a transparent substrate provided on one side with a grating form of repetitive groove-and-strip pattern for forming a diffraction grating with interference fringes of diffracted light through said repetitive pattern, characterized in that an optically transparent protective layer is applied over said one side with said repetitive groove-and-strip pattern formed thereon.

Preferably, the protective layer should comprise a sheet or film formed of any one of $SiO_2$, $CaF_2$, $MgF_2$, ZrO, HfO, and fluorine resin.

Preferably, the protective layer should be a sheet or film having a thickness of 0.1 mm to 2 mm.

According to this embodiment of the invention, there is also provided a diffraction grating-forming phase mask comprising a transparent substrate provided on one side with a grating form of repetitive groove-and-strip pattern for forming a diffraction grating with interference fringes of diffracted light through said repetitive pattern, characterized in that an optically transparent material layer having a refractive index different from that of said transparent substrate is applied over said one side with said repetitive groove-and-strip pattern formed thereon by film-forming means such as evaporation, CVD, sputtering or spin coating to fill up at least said groove, and a portion of said material layer exposed on said groove is polished flat.

Preferably, the transparent substrate comprises quartz, and the optically transparent material layer having a refractive index different from the transparent substrate is formed of any one of $CaF_2$, $MgF_2$, ZrO, HfO, and fluorine resin.

To accomplish the second object of the invention, the invention provides a diffraction grating-forming phase mask comprising a transparent substrate provided on one side with a grating form of repetitive groove-and-strip pattern for forming a diffraction grating with interference fringes of diffracted light through said repetitive pattern, characterized in that a section of said repetitive groove-and-strip pattern is in a substantially sine wave shape.

To achieve the first and second objects of the invention simultaneously, the invention provides a diffraction grating-forming phase mask comprising a transparent substrate provided on one side with a grating form of repetitive groove-and-strip pattern for forming a diffraction grating with interference fringes of diffracted light through said repetitive pattern, characterized in that a section of said repetitive groove-and-strip pattern is in a substantially sine wave shape, and a sheet or film form of protective layer, which has a thickness of 0.1 mm to 2 mm and is transparent to ultraviolet radiation, is applied over said side of said substrate with said repetitive groove-and-strip pattern formed thereon.

Preferably in this case, the protective layer is formed of any one of $SiO_2$, $CaF_2$, $MgF_2$, ZrO, HfO, and fluorine resin.

To achieve the first and second objects of the invention simultaneously, the invention also provides a diffraction grating-forming phase mask comprising a transparent substrate provided on one side with a grating form of repetitive groove-and-strip pattern for forming a diffraction grating with interference fringes of diffracted light through said repetitive pattern, characterized in that a section of said repetitive groove-and-strip pattern is in a substantially sine wave shape, and a material layer, which has a refractive index different from that of said transparent substrate and is transparent to ultraviolet radiation, is applied over said one side with said repetitive groove-and-strip pattern formed thereon by film-forming means such as evaporation, CVD, sputtering or spin coating to fill up at least said groove while a portion of said material layer exposed on said groove is polished flat.

Further, the invention provides a method for fabricating a diffraction grating-forming phase mask comprising a transparent substrate provided on one side with a grating form of repetitive groove-and-strip pattern for forming a diffraction grating with interference fringes of diffracted light through said repetitive pattern, wherein a section of said repetitive groove-and-strip pattern is in a substantially sine wave shape, characterized in that a grating form of groove of a rectangular shape in section is periodically provided on said one side of said transparent substrate, and wet etching is then carried out using an aqueous alkali solution or a hydrofluoric acid or its buffer solution to convert said sectional shape into a substantially sine wave shape.

Preferably in this case, the wet etching is carried out using a resist film or a chromium or other metal film as a mask.

In the phase mask embodiment provided to achieve the object of the invention, the optically transparent protective layer is applied over the surface of the substrate with the repetitive groove-and-strip pattern formed thereon, or the optically transparent material layer having a refractive index different from that of the transparent substrate is applied over the surface of the substrate by film-forming means such as evaporation, CVD, sputtering or spin coating to fill up at least the grooves while the portion of the material layer exposed on the grooves is polished flat. Even when foreign matters, resins sublimated from an optical fiber, etc. are deposited on the surface of the phase mask, therefore, the grating form of repetitive groove-and-strip pattern per se is kept intact, so that no defect can be introduced in the diffraction grating fabricated in the optical fiber, etc. Such foreign matters, resins sublimated from the optical fiber, etc. can be easily removed as by wiping.

In the phase mask embodiment provided to accomplish the second object of the invention, the section of the repetitive groove-and-strip pattern is in a substantially sine wave shape. When this diffraction grating-fabricating phase mask is transferred into an optical waveguide such as an optical fiber using ultraviolet laser light, it is thus possible to fabricate a diffraction grating having so high performance that no noise can be introduced in reflection spectra.

According to the fabrication method of the invention wherein a grating form of groove of a rectangular shape in section is periodically provided on one side of the transparent substrate, and wet etching is then carried out using an aqueous alkali solution or a hydrofluoric acid solution or its buffer solution to convert the sectional shape into a substantially sine wave shape, it is possible to make a diffraction grating-fabricating phase mask with the addition of simple steps.

BEST MODE OF CARRYING OUT THE INVENTION

The diffraction grating-forming phase mask according to the invention and the method thereof will now be explained with reference to some preferred embodiments.

First of all, the diffraction grating-forming phase mask provided to accomplish the first object of the invention is explained with reference to its basic construction as well as one embodiment of the fabrication method thereof.

Figure 1A:
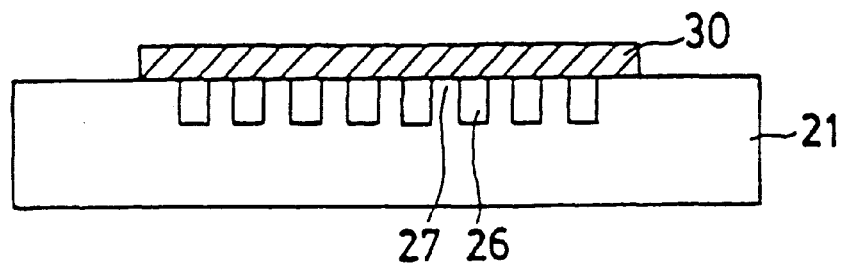
FIG. 1(a) is a sectional schematic of one embodiment of the diffraction grating-forming phase mask according to the invention.
Figure 1B:
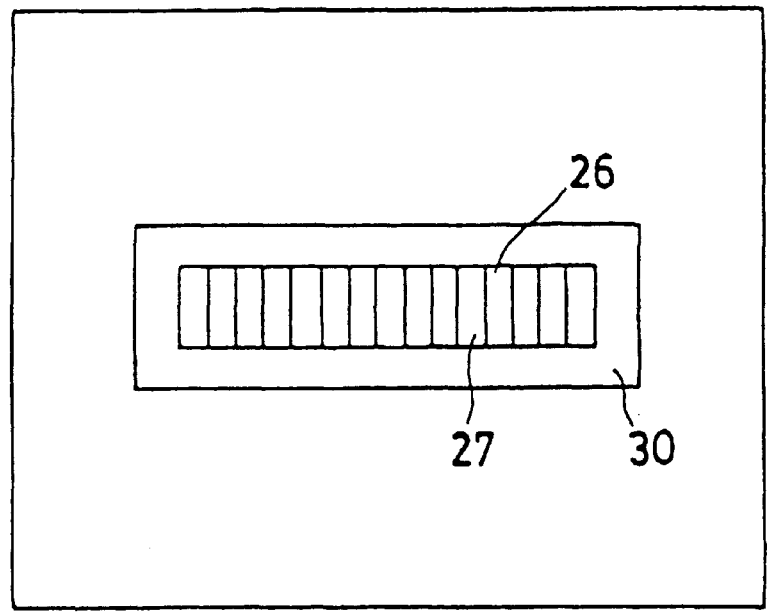
FIG. 1(b) is a plan view thereof.

FIG. 1(a) is a sectional schematic of one embodiment of the diffraction grating-forming phase mask according to the invention, and FIG. 1(b) is a plan view thereof. A phase mask shown generally at 21 is a binary phase type diffraction grating which, as is the case with a prior art phase mask, comprises a substrate transparent to ultraviolet radiation, e.g., a quartz glass substrate and an array of alternate grooves 26 and strips 27 provided on one side of the substrate at a given repetitive pitch and a given depth. In the phase mask according to this embodiment, a sheet or film form of protective layer 30 is provided over the side of the substrate with the grooves 26 and strips 27 formed thereon, thereby preventing entrance of foreign matters in grooves 26 or sublimation of an optical fiber-covering resin due to ultraviolet radiation, which sublimation may otherwise cause deposition of the resin to grooves 26. This protective layer 30, which is to be applied over the side of the phase mask 21 with the grooves 26 and strips 27 formed thereon, may be made up of a sheet or film having a thickness of 0.1 mm to 2 mm and comprising $SiO_2$, $CaF_2$, $MgF_2$, ZrO, HfO or a fluorine resin transparent to ultraviolet radiation.

Here consider that the phase mask is irradiated at its back side with ultraviolet laser light 23 while the side of the phase mask with the grooves 26 and strips 27 formed thereon is positioned in contact with an optical fiber 22 (FIG. 7) or spaced slightly away from the optical fiber 22. Although resins, etc. are sublimated by ultraviolet radiation from the covering of the optical fiber 22, yet they are not deposited into the grooves 26 because of being shielded by the protective layer 30. This then enables a repetitive pattern of the grating form of grooves 26 and strips 27 to be so maintained that the diffraction grating formed on the optical fiber 22 can be kept intact. The thus deposited resins or other foreign matters can be easily wiped out of the surface of the protective layer 30.

Figure 2A:
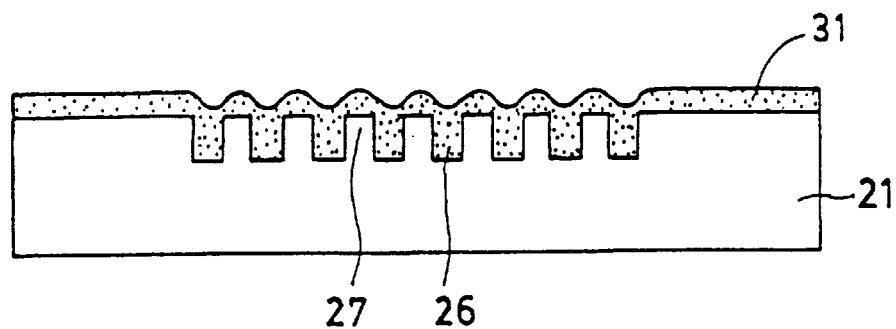
FIGS. 2(a) to 2(b) are a sectional schematic of another embodiment of the diffraction grating-forming phase mask according to the invention.
Figure 2B:
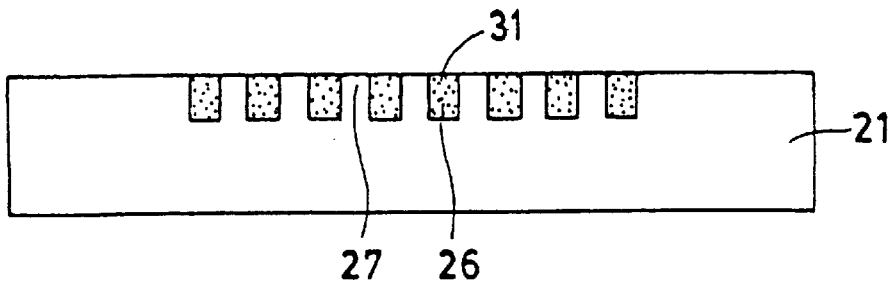

FIGS. 2(a) and 2(b) are sectional schematics of another embodiment of the diffraction grating-forming phase mask according to the invention. A phase mask shown generally at 21 is a binary phase type diffraction grating which, as is the case with a prior art phase mask, comprises a substrate transparent to ultraviolet radiation, e.g., a quartz glass substrate and an array of alternate grooves 26 and strips 27 provided on one side of the substrate at a given repetitive pitch and a given depth. In the phase mask according to this embodiment as shown in FIG. 2(a), a material layer 31 made up of $CaF_2$, $MgF_2$, ZrO, HfO or fluorine resin, which has a refractive index different from that of the transparent substrate and is transparent to ultraviolet radiation, is formed on a surface of the phase mask with the grooves 26 and strips 27 formed thereon by film formation techniques means such as evaporation, CVD, sputtering, and spin coating, thereby filling at least the grooves 26 with the material 31. As shown in FIG. 2(b), an exposed surface of the material layer is then polished flat by polishing techniques such as CMP (chemical mechanical polishing), so that the grooves 26 can be filled up with the material 31 having a refractive index different from that of the transparent substrate, thereby making the surface of the phase mask flat. It is here to be noted that polishing may be done in such a manner that a part of the material layer 31 remains on the strips 27 or some strips 27 become low.

In the phase mask according to this embodiment, too, resins, etc. sublimated from the covering of an optical fiber 22 due to exposure to ultraviolet radiation are not deposited into the grooves 26 because of being shielded by the material layer 31, as shown in FIG. 1. This then enables a repetitive pattern of the grating form of grooves 26 and strips 27 to be so maintained that the diffraction grating formed on the optical fiber 22 can be kept intact. The thus deposited resins or other foreign matters can be easily wiped out of the flat surface of the phase mask.

It is to be understood that it is acceptable to form such a protective layer 31 as shown in FIG. 1 on the phase mask shown in FIG. 2(b).

FIG. 3(a) to FIG. 3(h) are sectional views of one embodiment of the lithographic process of fabricating the aforesaid phase mask 21. In these figures, reference numeral 10 represents a phase mask blank, 11 a quartz substrate, 12 a chromium thin film, 12A a chromium thin-film pattern, 12B an opening in the chromium thin film, 13 an electron-beam resist, 13A a resist pattern, 13B a resist opening, 14 electron beams, 21 a phase mask, 26 a groove, and 27 a strip.

Figure 3A:
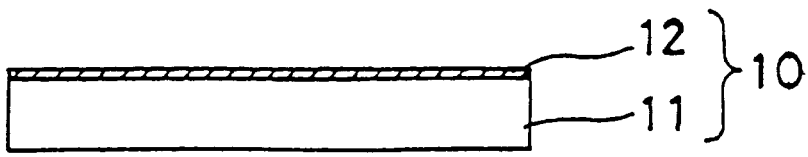
FIGS. 3(a) to 3(h) are sectional schematics illustrating the process of fabricating the phase mask according to the invention.

As shown in FIG. 3(a), the blank 10 was first prepared by forming the chromium thin film 12 of 150 Å in thickness on the quartz substrate 11. The chromium thin film 12 is useful for preventing a charging-up of the electron-beam resist at the electron-beam (14) irradiation step, and serves as a mask in the formation of the groove 26 on the quartz substrate. The thickness of this chromium thin film is important in view of resolution in chromium thin-film etching, and so should preferably be controlled to 100 to 200 Å.

Figure 3B:
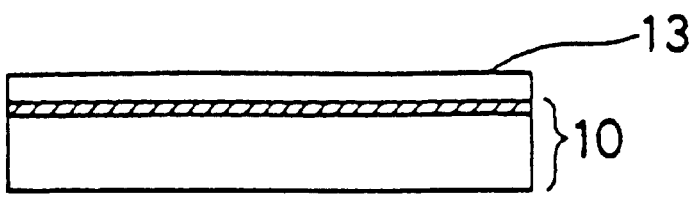

Then, electron-beam resist RE5100P (made by Hitachi Kasei Co., Ltd.) as the electron-beam resist 13 was coated on the chromium thin film 12 to a thickness of 400 nm, and dried, as shown in FIG. 3(b).

Figure 3C:
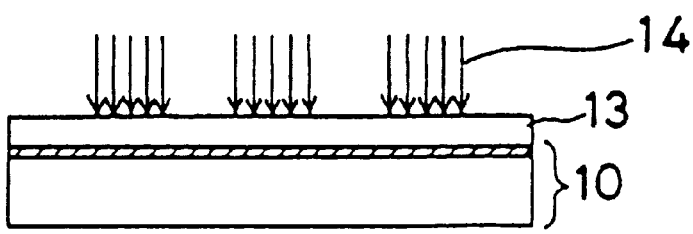

After this, the electron-beam resist 13 was exposed to light at an exposure of 1.2 $\mu C/cm^2$, as shown in FIG. 3(c), using an electron-beam writing system MEBESIII (made by ETEC), so that portions corresponding to the grooves 26 were exposed to the electron beams 14.

Figure 3D:
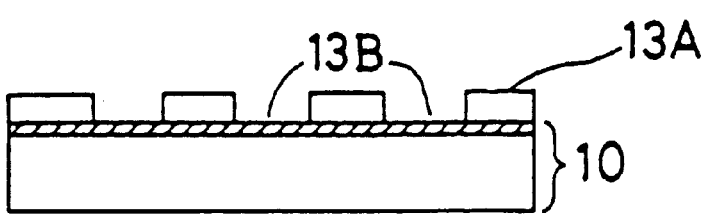

After the exposure, post-exposure baking (PEB) was carried out at 90° C. for 5 minutes, and the electron-beam resist 13 was developed with TMAH (tetramethylammonium hydroxide) at a concentration of 2.38%, thereby forming such desired resist pattern 13A as shown in FIG. 3(d). It is here noted that the post-exposure baking (PEB) is to selectively enhance the sensitivity of the portions irradiated with the electron beams 14.

Figure 3E:
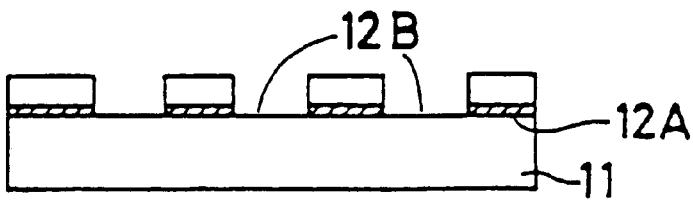

Then, dry etching was performed with $CH_2Cl_2$ gas while the resist pattern 13A was used as a mask, thereby forming such chromium thin-film pattern 12A as shown in FIG. 3(e).

Figure 3F:
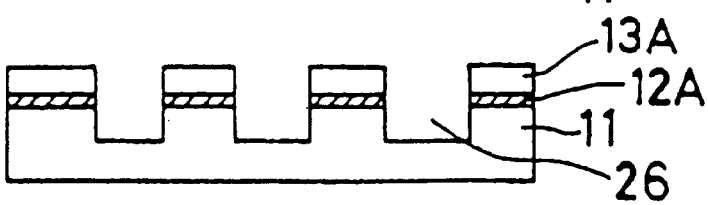

Subsequently, the quartz substrate 11 was etched with $CF_4$ gas to a depth of just 240 nm, while the chromium thin-film pattern 12A was used as a mask, as shown FIG. 3(f). Depth control was conducted by etching time control. Etching can occur while the etching depth is controlled in the range of 200 to 400 nm.

Figure 3G:
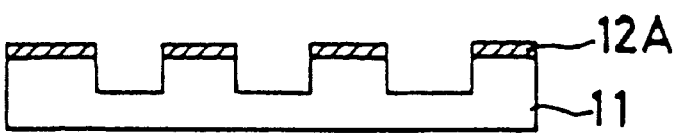
Figure 3H:
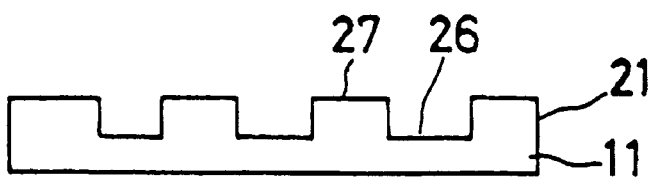

Following this, the resist pattern 13A was stripped off with sulfuric acid at 70° C., as shown in FIG. 3(g). Finally, the chromium thin-film pattern 12A was etched out with an ammonium ceric nitrate solution, as shown in FIG. 3(h), and scrubbing was carried out to obtain a complete line-and-space phase mask 21 having a depth of 240 nm and a pitch of 1.070 μm, wherein the lines and spaces corresponded to strips 27 and grooves 26, respectively.

Finally, a synthetic quartz sheet of 0.5 mm in thickness was applied on the thus prepared phase mask 21 to cover the line-and-space pattern, so that such a complete phase mask as depicted in FIG. 1 could be obtained.

The diffraction grating-forming phase mask provided to accomplish the second object of the invention is now explained with reference to its basic construction and one embodiment of the fabrication method thereof.

Figure 4A:
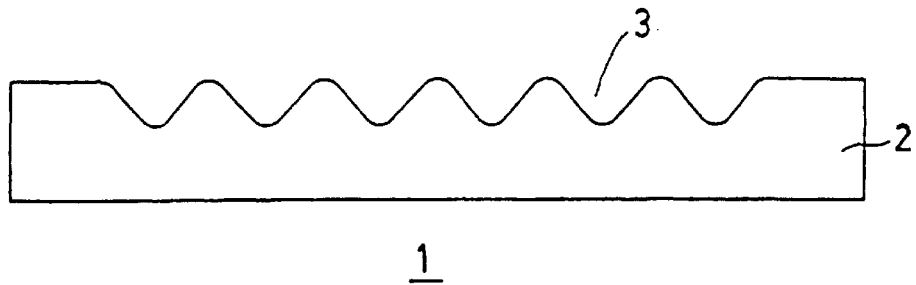
FIG. 4(a) is a sectional schematic of one embodiment of the diffraction grating-forming phase mask provided to achieve the second object of the invention.
Figure 4B:
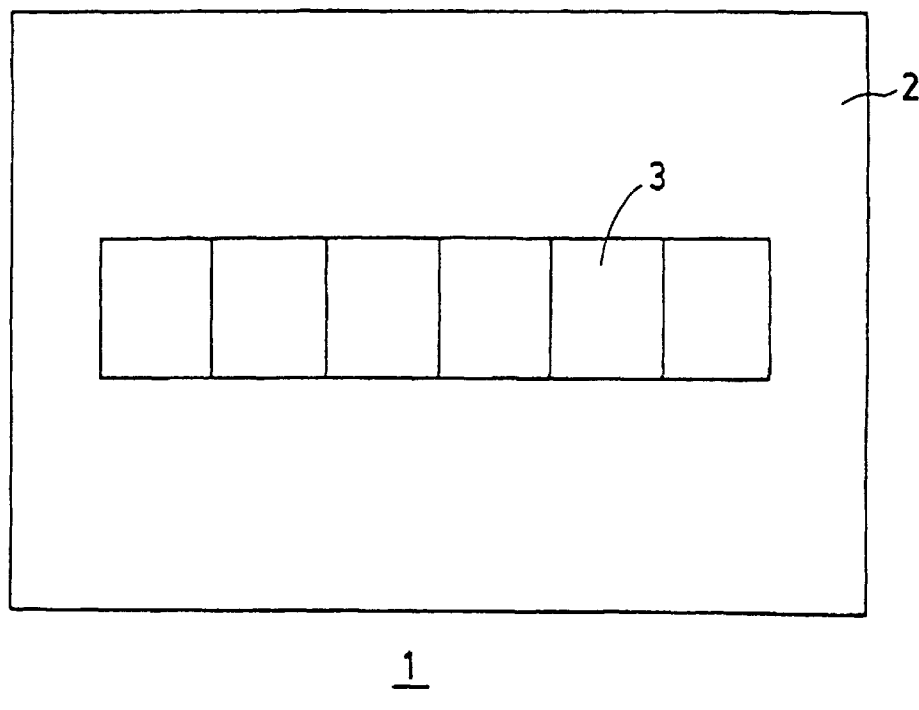
FIG. 4(b) is a plan view thereof.
Figure 7A:
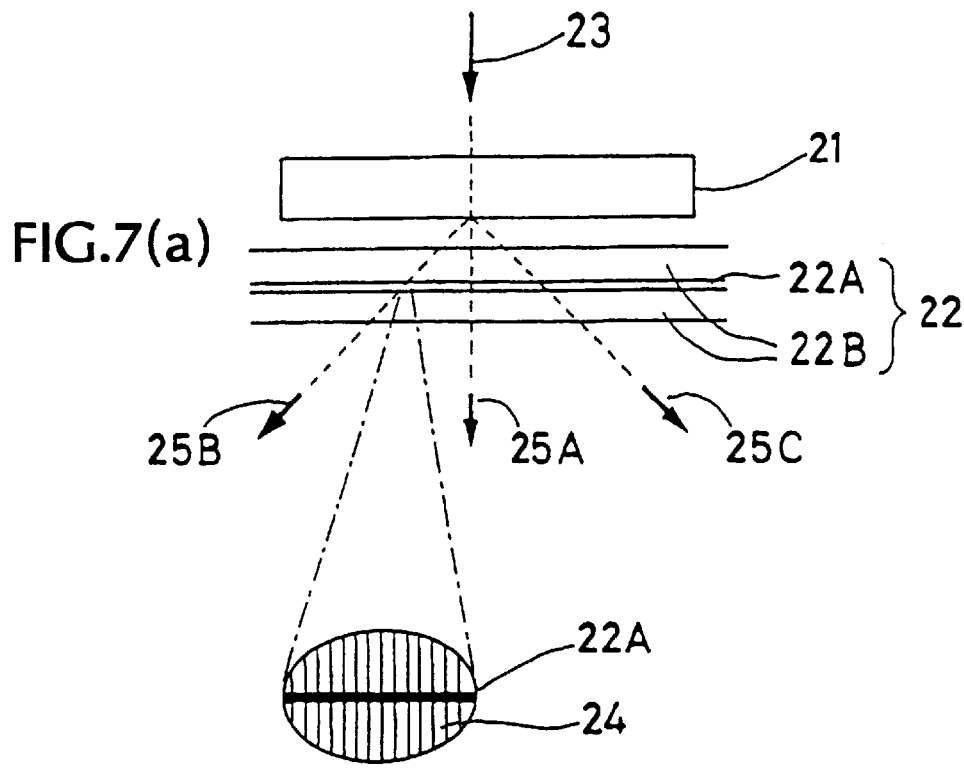
FIGS. 7(a) to 7(c) are illustrative of optical fiber processing and a phase mask used therewith.
Figure 7B:
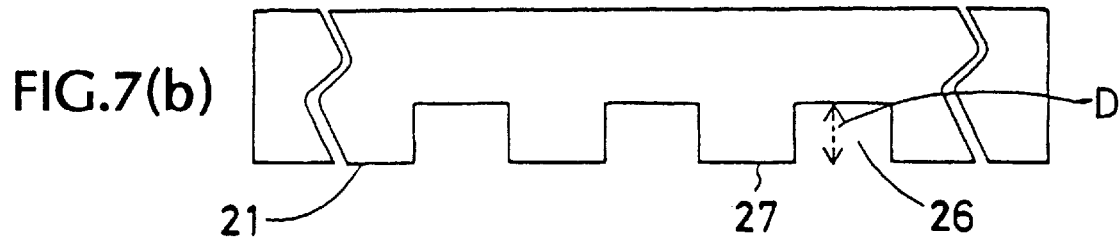
Figure 7C:
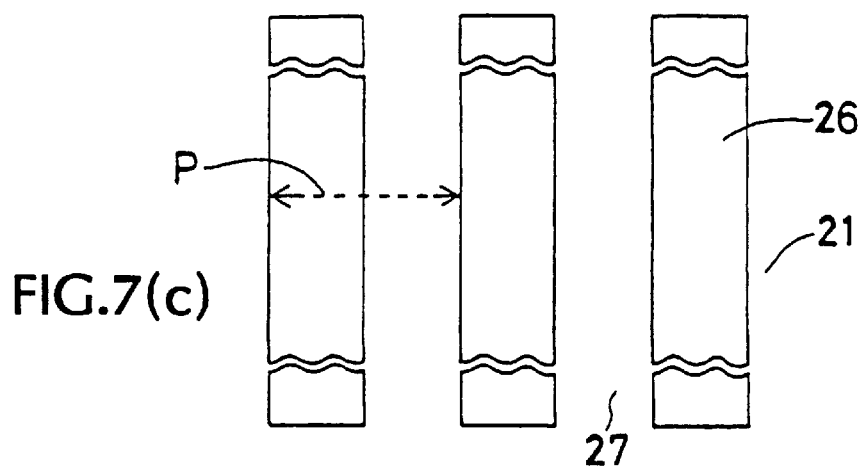

FIGS. 4(a) and 4(b) are sectional schematics of this embodiment of the diffraction grating-forming phase mask according to the invention. A phase mask shown generally at 1 comprises a quartz substrate 2 and a periodic groove 3 which is formed on its one side and is of a sine wave shape in section. Theoretically, a grating having such a sectional shape shows 0% transmittance with respect to zero-order light, and causes diffracted light to be primarily composed of + first-order light and − first-order light. Therefore, a diffraction grating fabricated into an optical waveguide such as an optical fiber by means of transfer using ultraviolet laser light according to such an arrangement as depicted in FIG. 7(a) can have so high a performance that no noise can be found in reflection spectra.

Such a groove 3 of a sine wave shape in section is provided by forming a groove of a rectangular wave shape in section on the quartz substrate 2, and then etching the whole surface of the side with the groove formed thereon for smooth removal of the edges of the rectangular waves. For the etching of the substrate having thereon the groove of a rectangular wave shape in section, it is acceptable to make use of drying etching. However, it is preferable to use wet etching because of its high isotropy. Preferably in this case, the wet etching should be carried out using an aqueous alkali solution such as an aqueous sodium or potassium hydroxide solution or a solution composed mainly of hydrofluoric acid.

How to fabricate the phase mask 1 of the invention in an optical fiber is explained with reference to examples.

EXAMPLE 1

FIG. 5(a) to FIG. 5(h) are sectional views of one embodiment of the process of fabricating the aforesaid phase mask 1. In these figures, reference numeral 5 represents a phase mask blank, 2 a quartz substrate, 4 a chromium thin film, 4A a chromium thin-film pattern, 4B an opening in the chromium thin film, 6 an electron-beam resist, 6A a resist pattern, 6B a resist opening, 14 an electron beam, 1 a phase mask, 3 a groove of a sine wave shape in section, 3' a groove of a rectangular wave shape in section, 8 a strip of a sine wave shape in section, and 8' a strip of a rectangular wave shape in section.

Figure 5A:
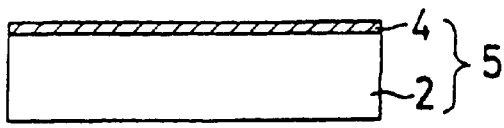
FIGS. 5(a) to 5(h) are sectional schematics of the process of fabricating Example 1 of the phase mask provided to accomplish the second object of the invention.

As shown in FIG. 5(a), the blank 5 was first prepared by forming the chromium thin film 4 of 20 nm in thickness on the quartz substrate 2 by sputtering. The chromium thin film 4 is useful for preventing a charging-up of the electron-beam resist 6 at the electron-beam (6) irradiation step, and serves as a mask in the formation of the groove 3' on the quartz substrate. The thickness of this chromium thin film is important in view of resolution in chromium thin-film etching, and so should preferably be controlled to 10 to 20 nm.

Figure 5B:
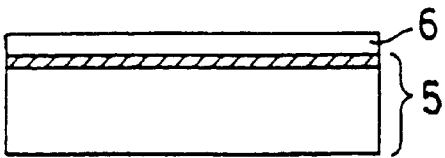

Then, electron-beam resist RE5100P (made by Hitachi Kasei Co., Ltd.) as the electron-beam resist 6 was coated on the chromium thin film to a thickness of 400 nm, and dried, as shown in FIG. 5(b).

Figure 5C:
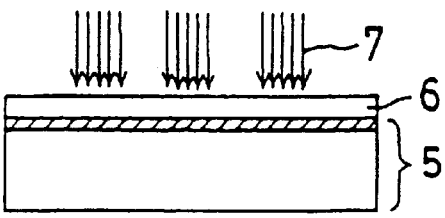

After this, the electron-beam resist 6 was exposed to light at an exposure of 1.2 $\mu C/cm^2$, as shown in FIG. 5(c), using an electron-beam writing system MEBESIII (made by ETEC), so that portions corresponding to the groove 3' were exposed to the electron beams 7.

Figure 5D:
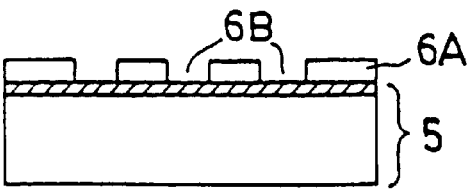

After the exposure, post-exposure baking (PEB) was carried out at 90° C. for 5 minutes, and the electron-beam resist 6 was developed with TMAH (tetramethylammonium hydroxide) at a concentration of 2.38%, thereby forming such desired resist pattern 6A as shown in FIG. 5(d). It is here noted that the post-exposure baking (PEB) is to selectively enhance the sensitivity of the portion irradiated with the electron beams 7.

Figure 5E:
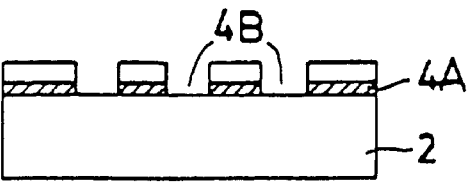

Then, dry etching was performed with $CH_2Cl_2$ gas while the resist pattern 6A was used as a mask, thereby forming such chromium thin-film pattern 4A as shown in FIG. 5(e).

Figure 5F:
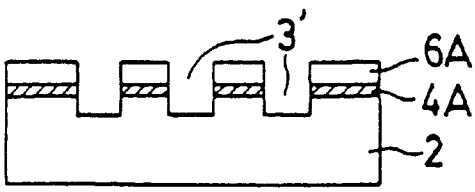

Subsequently, the quartz substrate 2 was etched with $CF_4$ gas to a depth of just 240 nm, while the chromium thin-film pattern 4A was used as a mask, as shown FIG. 5(f). Depth control was conducted by etching time control. Etching can occur while the etching depth is controlled in the range of 200 to 400 nm.

Figure 5G:
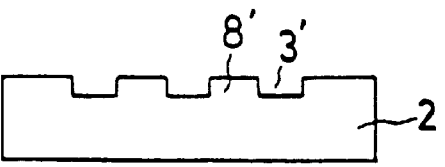

Following this, the resist pattern 6A was stripped off with sulfuric acid at 70° C., whereupon the chromium thin-film pattern 4A was etched out with an ammonium ceric nitrate solution, and scrubbing was carried out to obtain a complete line-and-space phase mask having a depth of 240 nm and a pitch of 1.070 μm, wherein the lines and spaces corresponded to strips 8' and grooves 3', respectively, as shown in FIG. 5(g).

Figure 5H:
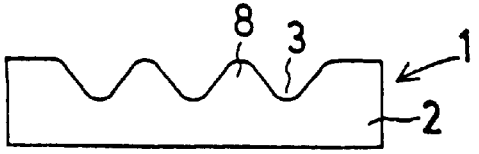

Subsequently, the FIG. 5(g) mask was wet etched at a temperature 80° C. using a 10% aqueous sodium hydroxide solution, thereby obtaining a complete phase mask having a diffraction grating pattern of such a sine wave shape in section as depicted in FIG. 5(h).

EXAMPLE 2

In this example, steps (a) to (b) are the same as those shown in FIGS. 5(a) to 5(d) for Example 1. That is, the blank 5 was first prepared by forming the chromium thin film 4 of 20 nm in thickness on the quartz substrate 2 by sputtering, as shown in FIG. 5(a).

Then, electron-beam resist RE5100P (made by Hitachi Kasei Co., Ltd.) as the electron-beam resist 6 was coated on the chromium thin film to a thickness of 400 nm, and dried, as shown in FIG. 5(b).

After this, the electron-beam resist 6 was exposed to light at an exposure of 1.2 $\mu C/cm^2$, as shown in FIG. 5(c), using an electron-beam writing system MEBESIII (made by ETEC), so that portions corresponding to the groove 3' were exposed to the electron beams 7.

After the exposure, post-exposure baking (PEB) was carried out at 90° C. for 5 minutes, and the electron-beam resist 6 was developed with TMAH (tetramethylammonium hydroxide) at a concentration of 2.38%, thereby forming such desired resist pattern 6A as shown in FIG. 5(d). It is here noted that the post-exposure baking (PEB) is to selectively enhance the sensitivity of the portion irradiated with the electron beams 7.

Figure 6A:
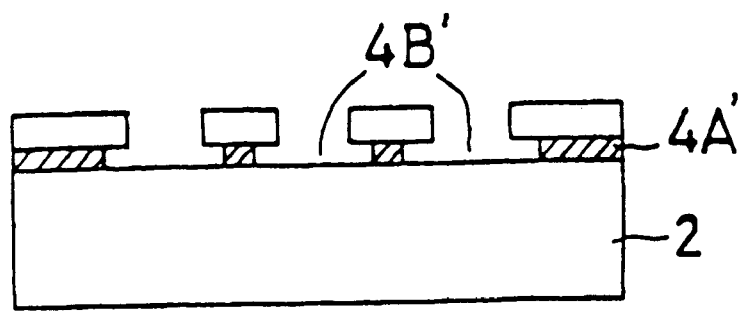
FIGS. 6(a) to 6(e) are sectional schematics of the process of fabricating Example 2 of the phase mask provided to achieve the second object of the invention.
Figure 6B:
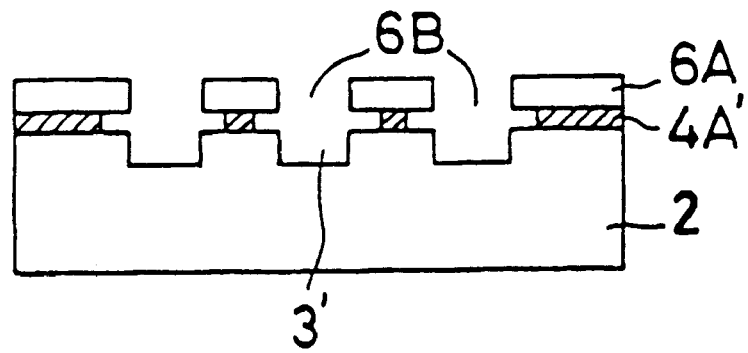

Then, wet etching was carried out using the resist pattern 6A as a mask, as shown in FIG. 6(a), thereby forming such a chromium thin film 4A' as shown. 4B' represents an opening in the chromium thin film.

Figure 6C:
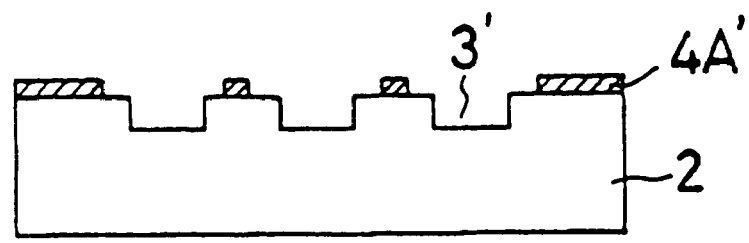

Then, the quartz substrate was etched to a depth of just 240 nm using the resist pattern 6A as a mask with $CF_4$ gas, as shown in FIG. 6(c).

Figure 6D:
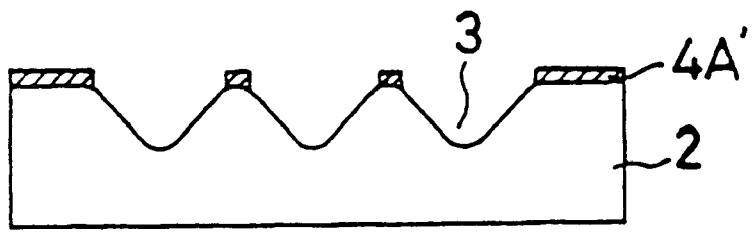
Figure 6E:
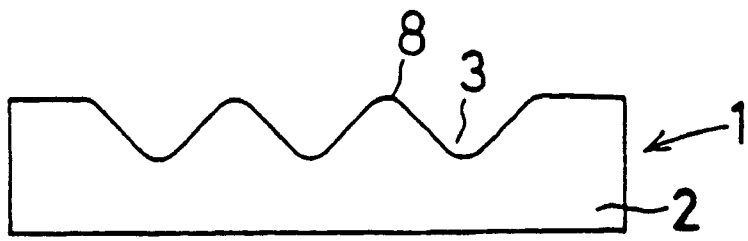

Then, while the remaining chromium thin film pattern 4A' was used as a mask, wet etching was carried out with 5% HF, as shown in FIG. 6(d). Following this, the chromium thin film pattern 4A' was etched out with an ammonium ceric nitrate solution. Finally, a complete phase mask 1 having a diffraction grating pattern of such a sine wave shape as shown in FIG. 6(e) was obtained through a scrubbing step.

EXAMPLE 3

Using the method as already explained, a transparent protective layer 30 was applied over the surface of the transparent substrate (FIG. 1) fabricated according to the FIG. 5 or 6 fabrication process. The section of the repetitive groove (26)-and-strip (27) pattern shown in FIG. 1 was in a substantially sine wave shape, as can be seen from the phase mask fabricated according to the FIG. 5 or 6 fabrication method. The transparent protective layer 30 was applied with respect to this phase mask, thereby covering the surface of the transparent substrate shown in FIG. 1.

EXAMPLE 4

Using the method as already explained, a material layer 31, which has a refractive index different from that of the transparent substrate of the phase mask fabricated according to the FIG. 5 or 6 fabrication method and is transparent to ultraviolet radiation, was applied over the substrate to fill up the groove 3, followed by polishing. That is, the section of the repetitive groove (26)-and-strip (27) pattern is in a substantially sine wave shape, as can be seen from the phase mask fabricated to the FIG. 5 or 6 fabrication method. The transparent material 31 that has a refractive index different from that of the transparent substrate shown in FIG. 2(a) and transparent to ultraviolet radiation was applied over this phase mask to fill up at least the groove 3. Following this, the material layer 31 was polished, thereby obtaining such a phase mask as shown in FIG. 2(b).

While the diffraction grating-forming phase mask of the invention and its fabrication method have been described with reference to some embodiments and examples, it is to be understood that the invention is not specifically limited thereto, and so many modifications may be made thereto.

INDUSTRIAL APPLICABILITY

In the phase mask embodiment provided to achieve the object of the invention, the optically transparent protective layer is applied over the surface of the substrate with the repetitive groove-and-strip pattern formed thereon, or the optically transparent material layer having a refractive index different from that of the transparent substrate is applied over the surface of the substrate by film-forming means such as evaporation, CVD, sputtering or spin coating to fill up at least the grooves while the portion of the material layer exposed on the grooves is polished flat. Even when foreign matters, resins sublimated from an optical fiber, etc. are deposited on the surface of the phase mask, therefore, the grating form of repetitive groove-and-strip pattern per se is kept intact, so that no defect can be introduced in the diffraction grating fabricated in the optical fiber, etc. Such foreign matters, resins sublimated from the optical fiber, etc. can be easily removed as by wiping.

In the phase mask embodiment provided to accomplish the second object of the invention, the section of the repetitive groove-and-strip pattern is in a substantially sine wave shape. When this diffraction grating-fabricating phase mask is transferred into an optical waveguide such as an optical fiber using ultraviolet laser light, it is thus possible to fabricate a diffraction grating having so high performance that no noise can be introduced in reflection spectra.

According to the fabrication method of the invention wherein a grating form of groove of a rectangular shape in section is periodically provided on one side of the transparent substrate, and wet etching is then carried out using an aqueous alkali solution or a hydrofluoric acid solution or its buffer solution to convert the sectional shape into a substantially sine wave shape, it is possible to make a diffraction grating-fabricating phase mask with the addition of simple steps.

The first and second objects of the invention may be achieved at the same time.

What we claim is:

1. A diffraction grating-forming phase mask comprising a transparent substrate provided on one side with a grating form of repetitive groove-and-strip pattern for forming a diffraction grating with interference fringes of diffracted light through said repetitive pattern, characterized in that an optically transparent protective layer is applied over said one side with said repetitive groove-and-strip pattern formed thereon, characterized in that said protective layer comprises a sheet or film formed of any one of $SiO_2$, $CaF_2$, $MgF_2$, ZrO, HfO, and fluorine resin.

2. The diffraction grating-forming phase mask according to claim 1, characterized in that said protective layer is a sheet or film having a thickness of 0.1 mm to 2 mm.

3. A diffraction grating-forming phase mask comprising a transparent substrate provided on one side with a grating form of repetitive groove-and-strip pattern for forming a diffraction grating with interference fringes of diffracted light through said repetitive pattern, characterized in that an optically transparent material layer having a refractive index different from that of said transparent substrate is applied over said one side with said repetitive groove-and-strip pattern formed thereon by film-forming means such as evaporation, CVD, sputtering or spin coating to fill up at least said groove, and a portion of said material layer exposed on said groove is polished flat, characterized in that said transparent substrate comprises quartz, and said optically transparent material layer having a refractive index different from said transparent substrate is formed of any one of $CaF_2$, $MgF_2$, ZrO, HfO, and fluorine resin.

4. A diffraction grating-forming phase mask comprising a transparent substrate provided on one side with a grating form of repetitive groove-and-strip pattern for forming a diffraction grating with interference fringes of diffracted light through said repetitive pattern, characterized in that a section of said repetitive groove-and-strip pattern is in a substantially sine wave shape, and a sheet or film form of protective layer, which has a thickness of 0.4 mm to 2 mm and is transparent to ultraviolet radiation, is applied over said side of said substrate with said repetitive groove-and-strip pattern formed thereon.

5. The diffraction grating-forming phase mask according to claim 4, characterized in that said protective layer comprises a sheet or film formed of any one of $SiO_2$, $CaF_2$, $MgF_2$, ZrO, HfO, and fluorine resin.

6. A method for fabricating a diffraction grating-forming phase mask comprising a transparent substrate provided on one side with a grating form of repetitive groove-and-strip pattern for forming a diffraction grating with interference fringes of diffracted light through said repetitive pattern, wherein a section of said repetitive groove-and-strip pattern is in a substantially sine wave shape, characterized in that a grating form of groove of a rectangular shape in section is periodically provided on said one side of said transparent substrate, and wet etching is then carried out using an aqueous alkali solution or a hydrofluoric acid or its buffer solution to convert said sectional shape into a substantially sine wave shape.

7. The method for fabricating a diffraction grating-forming phase mask according to claim 6, characterized in that said wet etching is carried out using a resist film or a chromium or other metal film as a mask.

8. The method for fabricating a diffraction grating-forming phase mask according to claim 6, further comprising applying a material layer, which has a refractive index different from that of said transparent substrate and is transparent to ultraviolet radiation, over at least one groove on said one side with said repetitive groove-and-strip pattern formed thereon.

9. The method for fabricating a diffraction grating-forming phase mask according to claim 8, wherein said step of applying a material layer comprises applying the material layer by film-forming means such as evaporation, CVD, sputtering or spin coating to fill up at least said groove.

10. The method for fabricating a diffraction grating-forming phase mask according to claim 8, further comprising the step of polishing a portion of said material layer exposed on said groove flat.

11. A diffraction grating-forming phase mask comprising a transparent substrate provided on one side with a grating form of repetitive groove-and-strip pattern for forming a diffraction grating with interference fringes of diffracted light through said repetitive pattern, characterized in that an optically transparent protective layer is applied over said one side with said repetitive groove-and-strip pattern formed thereon characterized in that said protective layer is a sheet or film having a thickness of 0.4 mm to 2 mm.

* * * * *